(12) United States Patent
Seningen et al.

(10) Patent No.: US 8,953,395 B2
(45) Date of Patent: *Feb. 10, 2015

(54) MEMORY WITH VARIABLE STRENGTH SENSE AMPLIFIER

(75) Inventors: Michael R. Seningen, Austin, TX (US); Michael E. Runas, McKinney, TX (US)

(73) Assignee: Apple Inc., Cupertino, CA (US)

( * ) Notice: Subject to any disclaimer, the term of this patent is extended or adjusted under 35 U.S.C. 154(b) by 436 days.

This patent is subject to a terminal disclaimer.

(21) Appl. No.: 13/403,564

(22) Filed: Feb. 23, 2012

(65) Prior Publication Data

US 2013/0223159 A1    Aug. 29, 2013

(51) Int. Cl.
G11C 7/08    (2006.01)

(52) U.S. Cl.
USPC ...................................... 365/189.15; 365/205

(58) Field of Classification Search
USPC ........................................... 365/189.15, 205
See application file for complete search history.

(56) References Cited

U.S. PATENT DOCUMENTS

| | | | |
|---|---|---|---|
| 5,068,830 A | 11/1991 | Plants et al. | |
| 5,610,866 A | 3/1997 | McClure | |
| 6,006,339 A | 12/1999 | McClure | |
| 6,052,321 A | 4/2000 | Roohparvar | |
| 6,268,972 B1 | 7/2001 | Philpott et al. | |
| 6,574,159 B2 | 6/2003 | Ohbayashi et al. | |
| 6,611,448 B2 | 8/2003 | Nair et al. | |
| 7,164,612 B1 | 1/2007 | Eleyan et al. | |
| 7,184,337 B2 | 2/2007 | Versen | |
| 7,298,659 B1 | 11/2007 | Kengeri et al. | |
| 7,313,041 B1 | 12/2007 | Chapman et al. | |
| 7,388,774 B1 * | 6/2008 | Kim .............................. | 365/154 |
| 7,642,620 B2 | 1/2010 | Tanaka | |
| 7,675,783 B2 | 3/2010 | Park et al. | |
| 7,724,584 B2 | 5/2010 | Lee | |
| 7,805,645 B2 | 9/2010 | Frey et al. | |
| 7,872,929 B2 | 1/2011 | Dell et al. | |
| 8,611,165 B2 | 12/2013 | Kazuno | |
| 2001/0043482 A1 * | 11/2001 | Takeyama et al. .............. | 365/23 |
| 2002/0118577 A1 * | 8/2002 | Lim ........................ | 365/189.07 |
| 2003/0107920 A1 | 6/2003 | Roohparvar | |
| 2003/0206435 A1 | 11/2003 | Takahashi | |
| 2006/0242386 A1 | 10/2006 | Wood | |
| 2007/0268761 A1 * | 11/2007 | Singh ............................ | 365/200 |
| 2008/0130385 A1 | 6/2008 | Chung | |
| 2010/0246293 A1 | 9/2010 | Dudeck et al. | |

(Continued)

FOREIGN PATENT DOCUMENTS

KR    20030079078    10/2003

OTHER PUBLICATIONS

Machine translation of KR 2003-0079078 by Koh at Samsung Electronics Co Ltd, which was cited in IDS filed on Oct. 26, 2012.*

(Continued)

*Primary Examiner* — Hoai V Ho
*Assistant Examiner* — Jay Radke
(74) *Attorney, Agent, or Firm* — Meyertons, Hood, Kivlin, Kowert & Goetzel, P.C.

(57) ABSTRACT

Embodiments of a memory are disclosed that may reduce the likelihood of a misread while reading a weak data storage cell. The memory column may include a number of data storage cells, a column multiplexer, and a sense amplifier. The sense amplifier may have two or more gain elements which can be individually selected to adjust the gain level of the sense amplifier.

10 Claims, 11 Drawing Sheets

(56) References Cited

U.S. PATENT DOCUMENTS

| | | | |
|---|---|---|---|
| 2011/0116300 A1 | 5/2011 | Maejima | |
| 2011/0145513 A1* | 6/2011 | Iyer et al. | 711/141 |
| 2012/0008384 A1 | 1/2012 | Li et al. | |
| 2012/0069638 A1 | 3/2012 | Matsuda et al. | |
| 2012/0230116 A1 | 9/2012 | Goda et al. | |

OTHER PUBLICATIONS

Mukhopadhyay et al., "Leakage Current Based Stabilization Scheme for Robust Sense-Amplifier Design for Yield Enhancement in Nano-scale SRAM," Proceedings of the 14th Asian Test Symposium (ATS '05), Dec. 18-21, 2005, pp. 176-181.

Paul Zuber, et al., "A Holistic Approach for Statistical SRAM Analysis," published in 47th ACM/IEEE Design Automation Conference (DAC), Jun. 13-18, 2010, pp. 717-722.

Mohamed H. Abu-Rahma, et al., "A Methodology for Statistical Estimation of Read Access Yield in SRAMs," published in 45th ACM/IEEE Design Automation Conference (DAC), Jun. 8-13, 2008, pp. 205-210.

\* cited by examiner

US 8,953,395 B2

MEMORY WITH VARIABLE STRENGTH SENSE AMPLIFIER

BACKGROUND

1. Technical Field

This invention is related to the field of memory implementation, and more particularly to sensing techniques.

2. Description of the Related Art

Memories typically include a number of data storage cells composed of interconnected transistors fabricated on a semiconductor substrate. Such data storage cells may store a single data bit or multiple data bits and may be constructed according to a number of different circuit design styles. For example, the data storage cells may be implemented as a single transistor coupled to a capacitor to form a dynamic storage cell. Alternatively, cross-couple inverters may be employed to form a static storage cell or a floating gate MOSFET may be used to create a non-volatile storage cell.

During the semiconductor manufacturing process, variations in lithography, transistor dopant levels, etc., may result in different electrical characteristics between transistors that are intended to have identical characteristics. This difference in electrical characteristics between transistors can result in data storage cells that output different small signal voltages for the same stored data. In a memory array, there may be a large variation in the output voltages across the data storage cells that make up the memory array.

Data from storage cells that generate a smaller than average output signal due to the previously described variation may not be able to be read correctly, resulting in a misread. Data storage cells that fail to read properly may contribute to lower manufacturing yield and necessitate additional redundant data storage cells to maintain manufacturing yield goals.

SUMMARY

Various embodiments of a memory circuit are disclosed. In an embodiment, the memory circuit may include a column having a plurality of data storage cells, a column multiplexer, and a sense amplifier with multiple gain levels. The sense amplifier may be operable to controllably select one of the gain levels depending on which data storage cell is selected.

During operation, the strength of a data storage cell may be determined and the data stored in the cell amplified by the sense amplifier with a selected gain level. Information indicative of the detected strength of the data storage cell may be stored and checked before amplifying data stored in the data storage cell.

BRIEF DESCRIPTION OF THE DRAWINGS

The following detailed description makes reference to the accompanying drawings, which are now briefly described.

Figure 1:
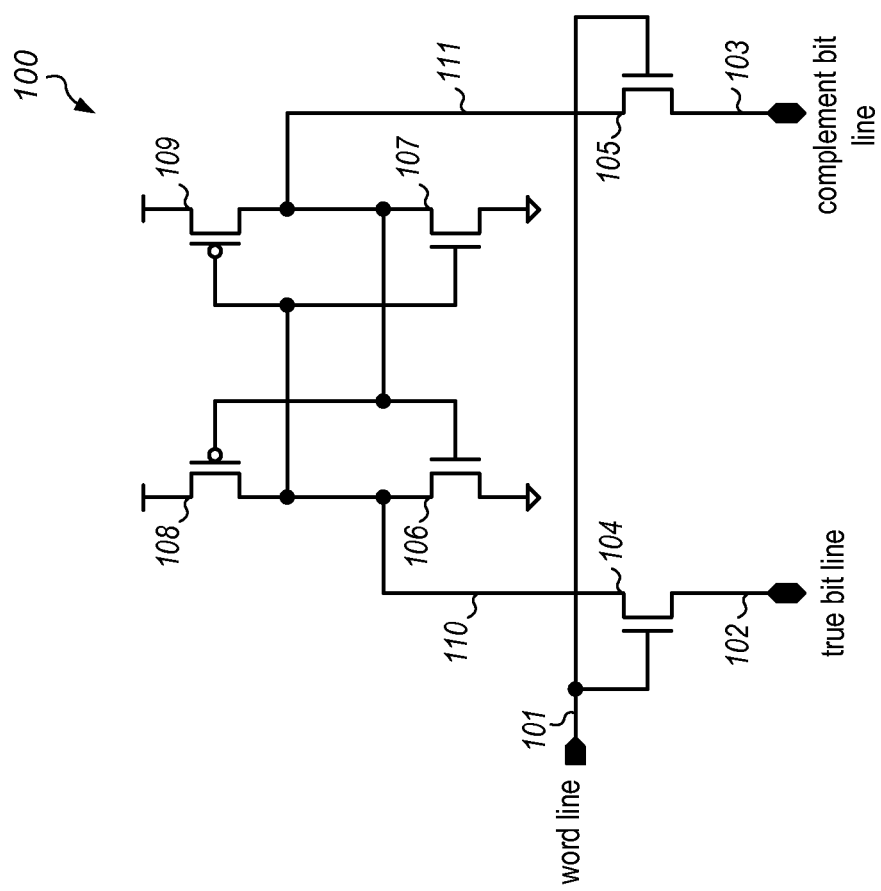
FIG. 1 illustrates an embodiment of a data storage cell.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the disclosure is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

FIG. 1 illustrates an exemplary circuit configuration of a data storage cell. In the illustrated embodiment, the storage mechanism is two cross-coupled inverters. One of the inverters includes transistors 108 and 106 and the other includes transistors 109 and 107. The input of the inverter including transistors 108 and 106 is coupled to node 111 and its output is coupled to node 110. The input of the inverter including transistors 109 and 107 is coupled to node 110 and its output is coupled to node 111. Transistor 104 is configured to couple true bit line 102 to node 110 is response to word line 101 and transistor 105 is configured to couple complement bit line 103 to node 111 in response to word line 101.

It is noted that although selection transistors, pull-up transistors, pull-down transistors, and pre-charge transistors may be illustrated as individual transistors, in other embodiments, any of these transistors may be implemented using multiple transistors or other suitable circuits. That is, in various embodiments, a "transistor" may correspond to an individual transistor or other switching element of any suitable type (e.g., a field-effect transistor (FET)), or to a collection of transistors.

At the start of the storage operation true bit line 102 and complement bit line 103 are both high and word line 101 low.

It is noted that in this embodiment, low refers to a voltage at or near ground potential and high refers to a voltage sufficiently large to turn on n-channel metal oxide semiconductor field effect transistors (MOSFETs) and turn off p-channel MOSFETs. In other embodiments, other circuit configurations may be used and the voltages that constitute low and high may be different. During the storage, or write, operation, word line 101 is switched high which couples true bit line 102 to node 110 and complement bit line 103 to node 111. To store a logical 1 into the storage cell, complement bit line is switched to a low. Since transistor 105 is on, node 111 is also switched low. The inverter including transistors 108 and 106 inverts the low on node 111 to a high on node 110. The inverter including transistors 109 and 107 invert the high on node 110 reinforcing the low on node 111. Once this feedback between nodes 110 and 111 has been established, word line 101 is switched low turning off transistors 104 and 105, isolating node 110 from true bit line 102 and node 111 from complement bit line 103. The method of storing a logical 0 is similar only true bit line 102 is switched low once word line 101 has been switched high.

In the illustrated embodiment, the data storage cell outputs its stored data as the difference in voltage between true bit line 102 and complement bit line 103. The output process is accomplished by pre-charging true bit line 102 and complement bit line 103 high and asserting word line 101 which turns on transistors 104 and 105. If node 111 is low and node 110 is high, then a current will flow through transistors 105 and 107 causing a reduction in voltage on the complement bit line 103. If node 110 is low and node 111 is high, then a current will flow through transistors 104 and 106 causing a reduction in voltage on the true bit line 102. For either data state, the difference in voltage between the true bit line 102 and the complement bit line may be amplified by a sense amplifier.

Ideally, the electrical characteristics of transistors 106 and 107 would be identical, as would be the electrical characteristics of transistors 104 and 105. Furthermore, in an ideal circuit, it might be desirable that transistors 106 and 107 in one data storage cell in a memory device have identical electrical characteristics to transistors 106 and 107 in another data storage cell in the memory device. However, during the semiconductor manufacturing process, differences in lithography, fluctuations in dopant levels, etc., may result in these transistors having different electrical characteristics. Aging effects may also change a transistor's electrical characteristics over time. Variation, due to both manufacturing and aging effects, in transistors 106, 107, 104 and 105 from one data storage cell to another may result in variation in voltages on the bit lines for the same stored data.

In some cases, the variation in the electrical characteristics of the transistors may result in larger than average output voltages when the storage cell is read. Storage cells that generate larger than average output voltages may be referred to as strong cells. In some cases, the variation in the electrical characteristic of the transistors may result in smaller than average output voltages when the storage cell is read. Storage cells that generate smaller than average output voltages may be referred to as weak cells. If the value of the output voltage generated by a weak storage cell is sufficiently small, it may be necessary to use an amplifier with a larger gain in order to properly detect the stored data, because the output voltage may not be able to overcome imbalances and signal noise within a sense amplifier.

It is noted that the number of transistors and the connectivity shown in FIG. 1 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as in a single-bit or multi-bit non-volatile or "flash" memory) may be used to store data in a data storage cell.

Figure 2:
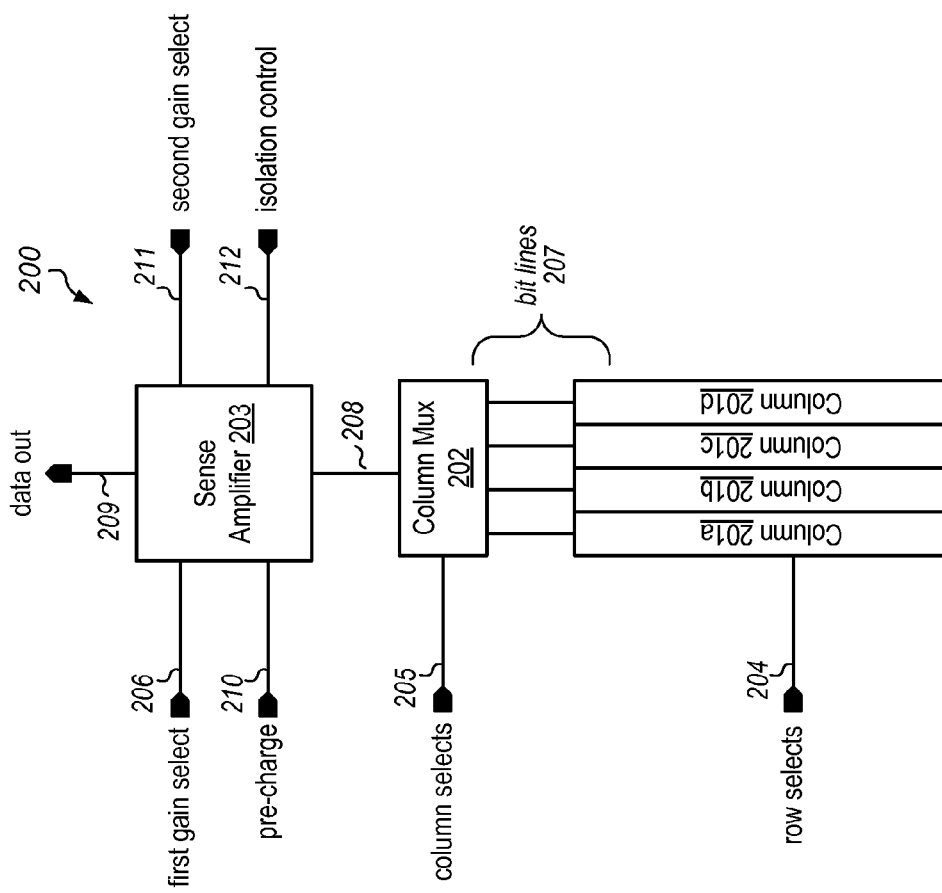
FIG. 2 illustrates an embodiment of memory sub-array.

FIG. 2 illustrates an embodiment of a memory sub-array. In the illustrated embodiment, columns 201*a*, 201*b*, 201*c*, and 201*d* are coupled to the inputs of column multiplexer 202. The output of column multiplexer 202 is coupled to the input of sense amplifier 203, and the output of sense amplifier 203 is couple to data output port 209.

Each column may include one or more data storage cells. The storage cells may be dynamic storage cells, static storage cells, single-bit or multi-bit non-volatile storage cells, or mask programmable read-only storage cells. Within each column, the input/output ports of each data storage cell are coupled to a common set of bit lines, and each data storage cell is selectable by one of the row select signals 204, such that one of the row selects signals 204 is asserted, the corresponding data storage cell generates an output voltage on the bit lines for the column. It is noted that in some embodiments, the data storage cells stored differentially encoded data (e.g., SRAM cells). In such cases, a true and complement bit line is required for each column. In other embodiments, the data storage cells do not store differentially encoded data and there is only a single bit line per column.

In some embodiments, column multiplexer 202 may contain one or more pass-gates whose inputs are coupled to the outputs of columns 201*a*, 201*b*, 201*c*, and 201*d*, and whose outputs are coupled together to form the multiplexer structure. In some embodiments, the pass-gates may contain complementary devices and column selects 205 may include both true and complementary versions of the signals.

In some embodiments, the illustrated sub-array may operate as follows. Referring collectively to FIG. 2 and the flow chart illustrated in FIG. 3, the operation starts by initializing the sub-array (block 301), asserting pre-charge signal 210, and setting row selects 204, column selects 205, first gain select signal 206, second gain select signal 211, and isolation control signal 212 to inactive states. Once the sub-array has been initialized, one of row selects 204 may be asserted (block 302), selecting a data storage cell in each of columns 201*a*, 201*b*, 201*c*, and 201*d*. One of column selects 205 is then asserted (block 303), causing the output of one of the columns (i.e., bit lines 207), to be passed to the column multiplexer output 208.

The operation then depends on the strength of the selected data storage cell (block 304). When the selected data storage cell is weak, the second gain level of sense amplifier 203 may be selected by asserting second gain select signal 211 and isolation control signal 212 (block 306), and the data on column multiplexer output 208 is amplified by the second gain level of sense amplifier 203 and coupled to data out 209 (block 307). The sub-array may then be initialized by de-asserting second gain signal 211, isolation control signal 212, row selects 204, and column selects 205, and asserting pre-charge signal 210 (block 301). When the selected data storage cell is not weak, the first gain level of sense amplifier 203 may be selected by asserting first gain select signal 211 and isolation control signal 212 (block 306), and the data on column multiplexer output 208 is amplified by the first gain level of sense amplifier 203 and coupled to data out 209 (block 307). The sub-array may then be initialized by de-asserting first gain select signal 206, isolation control signal 212, row selects 204, and column selects 205, and asserting pre-charge signal 210 (block 301).

Figure 3:
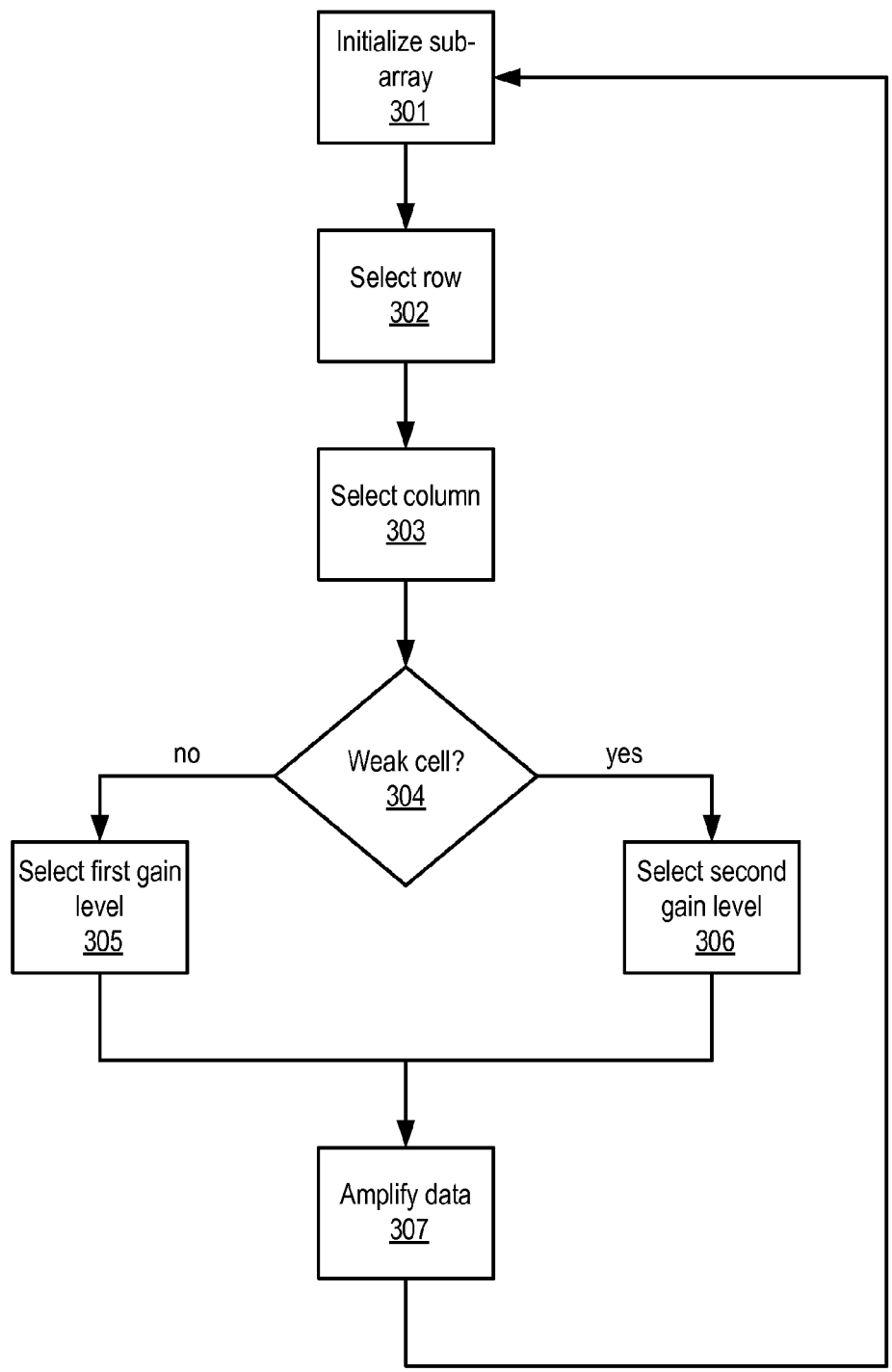
FIG. 3 illustrates a possible method of operating the embodiment illustrated in FIG. 2.

It is noted that to facilitate exposition, some operations shown in FIG. 3 are illustrated sequentially. However, during actual circuit operation, some or all of these operations may occur in a different order than shown, or may occur concurrently rather than sequentially.

Figure 4:
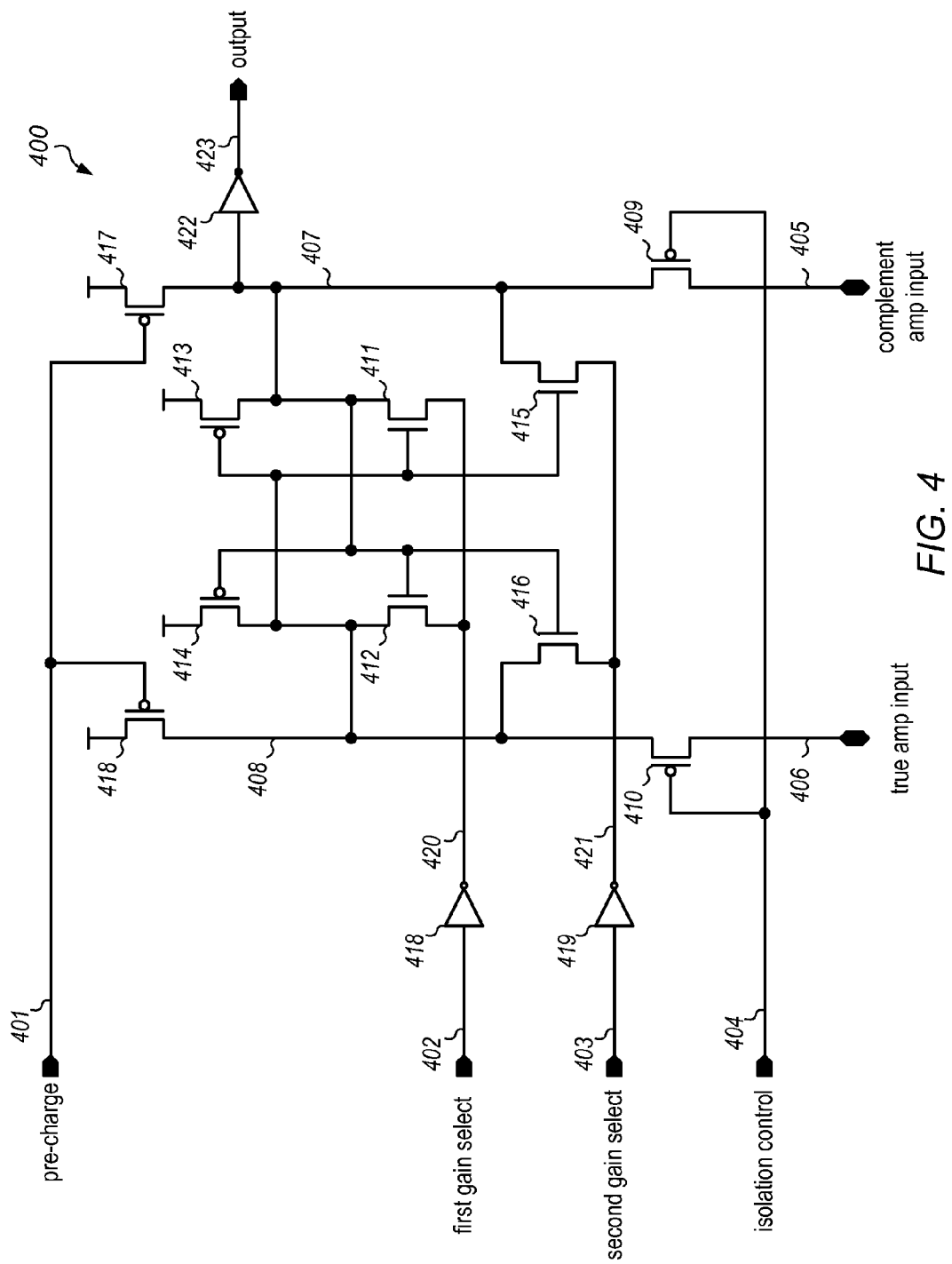
FIG. 4 illustrates an embodiment of a sense amplifier.

FIG. 4 illustrates a sense amplifier according one of several possible embodiments that may be coupled to receive differentially encoded data from the output of a column multiplexer as described above in reference to FIG. 2. In the illustrated embodiment, sense amplifier 400 includes true amplifier input 406, complement amplifier input 405, isolation control input 404, pre-charge input 401, first gain select input 402, second gain select 403, and output 423.

In the illustrated embodiment, true amplifier input 406 is couple to isolation device 410 which is further coupled to node 408. Complement amplifier input 405 is coupled to isolation device 409 which is further coupled to node 407. Isolation devices 410 and 409 are controlled by isolation control signal 404. Node 408 is further coupled to pre-charge device 418, pull-up device 414, and gain devices 412 and 416. Node 407 is further coupled to pre-charge device 417, pull-up device 413, gain devices 411 and 415, and drives output node 423 through inverter 422. Pre-charge devices 418 and 417 are controlled by pre-charge signal 401. Pull-up device 414 and gain devices 412 and 416 are controlled by the voltage on node 407. Pull-up device 413 and gain devices 411 and 415 are controlled by the voltage on node 408. Gain devices 412 and 411 are further coupled to node 420. Node 420 is further coupled to inverter 418 which is coupled to first gain select signal 402. Gain devices 416 and 416 are coupled to node 421. Node 320 is further coupled to inverter 419 which is coupled to second gain select signal 403.

In some embodiments, inverter 422 may include a control input. (An inverter having such a control input may also be referred to herein as a "clocked inverter" or a "controllable inverter" although it is noted that the signal that drives the control input need not necessarily be a clock signal, but may be any type of control signal.)

It is noted that static CMOS inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS. Moreover, it is noted that although pre-charge devices and isolation devices may be illustrated as individual transistors, in other embodiments, any of these devices may be implemented using multiple transistors or other suitable circuits. That is, in various embodiments a "device" may correspond to an individual transistor or other switching element of any suitable type (e.g., a FET), to a collection of transistors or switches, to a logic gate or circuit, or the like.

In some embodiments, the illustrated sense amplifier may operate as follows. During pre-charge mode, pre-charge signal 401 may be low which activates pre-charge devices 418 and 417 causing nodes 408 and 407 to be pre-charged high. First gain select signal 402 and second gain select signal 403 may be low which drives nodes 420 and 421 high through inverters 418 and 419. Isolation control signal 404 may be low activating isolation devices 410 and 409 thereby coupling true amplifier input 406 to node 408 and complement amplifier input 405 to node 407.

During amplification mode, pre-charge signal 401 may be high deactivating pre-charge devices 418 and 417. When a data storage cell is selected, the voltage of one of the sense amplifier inputs 405 and 406 will decline relative to the other input in accordance with the data stored in the cell. Isolation control signal 404 may be switched high causing isolation devices 410 and 409 to turn off, decoupling true amplifier input 406 from node 408 and complement amplifier input 405 from node 407. First gain select signal 402 may be switched high driving node 420 low through inverter 418. In response to node 420 going low, gain devices 412 and 411 begin to activate starting the previously described regenerative feedback until one of nodes 408 or 407 is discharged to ground in accordance to the data from the data storage cell.

In some embodiments, second gain select signal 403 may be switched high driving node 421 low through inverter 419. In response to node 421 going low, gain devices 416 and 415 activate starting the previously described regenerative feedback until one of nodes 408 or 407 is discharged to ground in accordance with the data from the data storage cell.

In some embodiments, first gain select signal 402 and second gain select signal 403 may be switched high simultaneously. In other embodiments, gain devices 412, 411, 416, and 415 may have substantially the same strength, while, in other embodiments, the gain devices may have differing strengths. In the illustrated embodiment, "strength" is a measure of the device's transconductance, which may be a function of the physical size of the device. In other embodiments, a device's "strength" may be controlled by different physical parameters and be measured by different means.

It is noted that the number of transistors and connectivity shown in FIG. 4 are merely an illustrative example, and that in other embodiments, other numbers, configurations and types of transistors may be employed.

Figure 5:
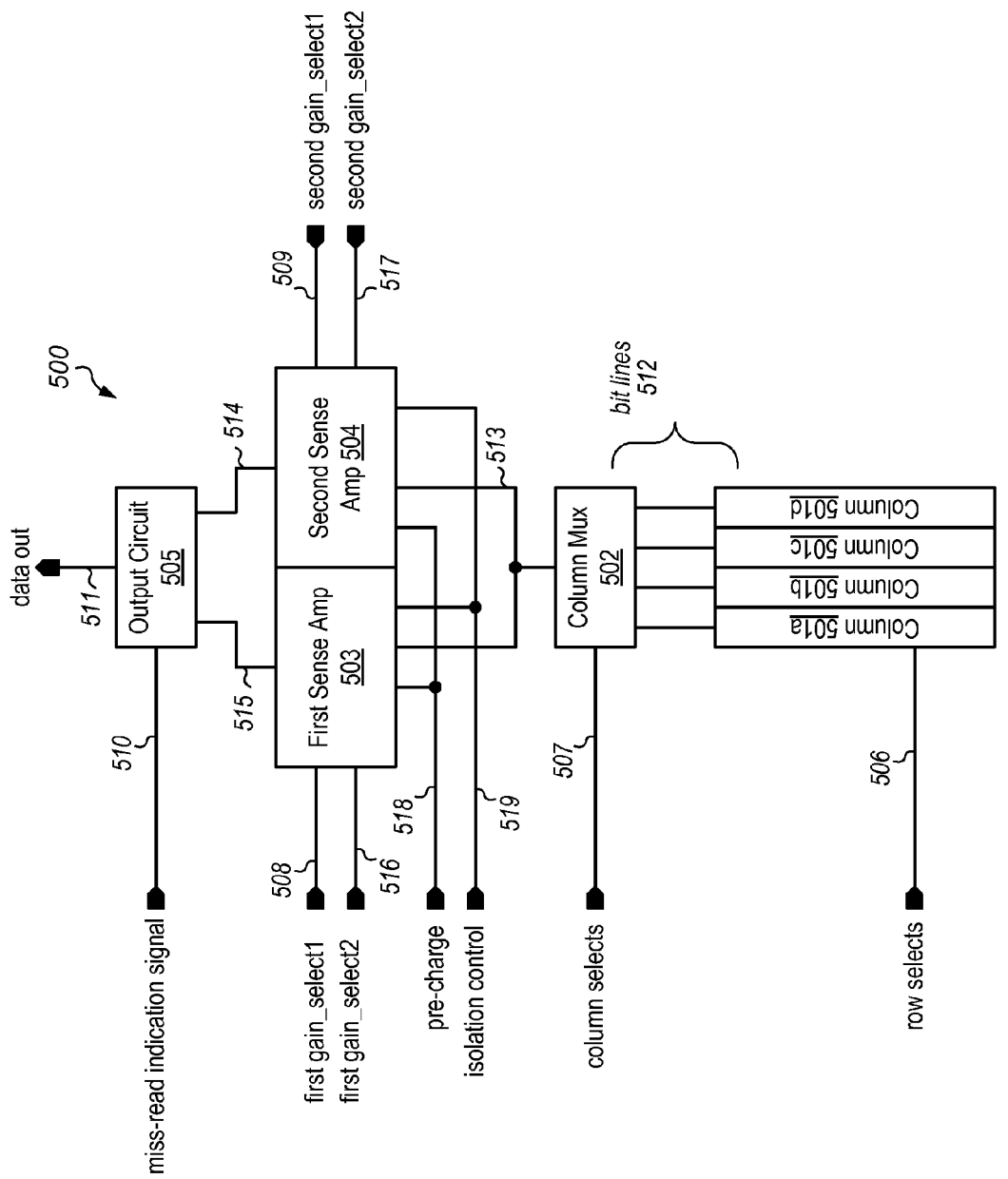
FIG. 5 illustrates an embodiment of a memory sub-array with multiple sense amplifiers.

FIG. 5 illustrates an embodiment of a memory sub-array. In the illustrated embodiment, columns 501a, 501b, 501c, and 501d are coupled to the inputs of column multiplexer 502 through bit lines 512. The output of column multiplexer 502 is couple to the input of first sense amplifier 502 and the input of second sense amplifier 504. First sense amplifier 503 and second sense amplifier 504 may contain some or all of the features of the previously described sense amplifier 400. The output of first sense amplifier 503 is coupled to an input of output circuit 505, and the output of second sense amplifier 504 is coupled to another input of output circuit 505. The output of output circuit 505 is coupled to data out 511. Each of columns may contain some or all of the features of columns 201a, 201b, 201c, and 201d as described with reference to FIG. 2.

Output circuit 505 logically combines the data on nodes 515 and 514 to generate data out 511. The logical combination may be performed using a multiplexer that selects between the nodes 515 and 514 based upon the state of misread indication signal 510. In other embodiments, the output circuit may include a node that couples the output of the first sense amplifier and the output of the second sense amplifier, and the output of the first sense amplifier and the output of the second amplifier may be able to enter a high impedance state determined by the states of misread indication signal 510, first gain_select1 signal 508, first gain_select2 signal 516, second gain_select1 signal 509, and second gain_select2 signal 517.

Figure 6:
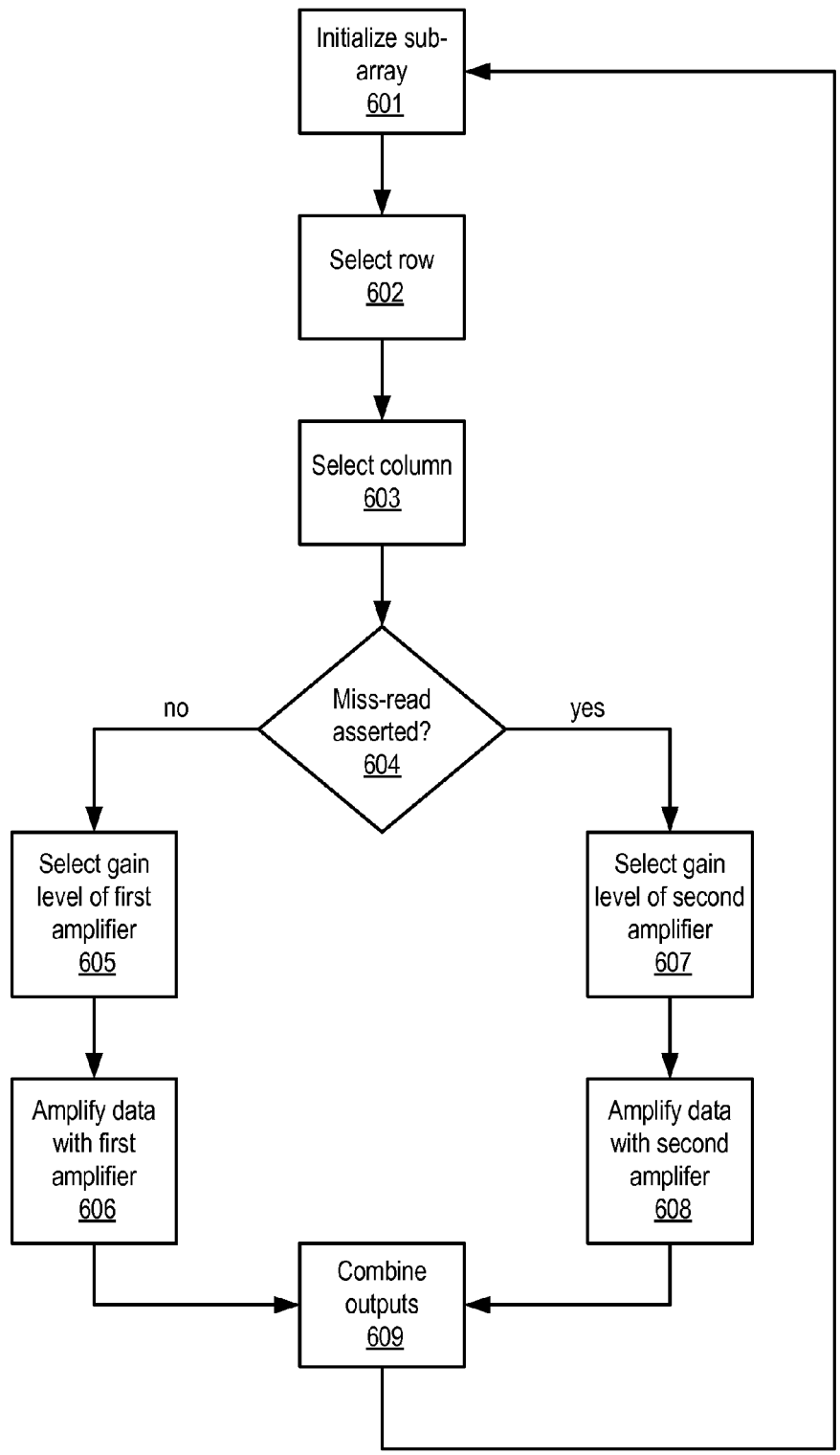
FIG. 6 illustrates a possible method of operating the embodiment illustrated in FIG. 5.

Referring collectively to FIG. 5 and the flow chart illustrated in FIG. 6, the illustrated embodiment may operate as follows. The operation starts by initializing the sub-array (block 601) by asserting pre-charge signal 518 and setting row selects 506, column selects 507, first gain_select1 signal 508, first gain_select2 signal 516, second gain_select1 signal 509, second gain_select2 signal 517, and isolation control signal 519 to inactive states. Once the sub-array has been initialized, one of row selects 506 may be asserted (block 602), selecting a data storage cell in each of columns 501a, 501b, 501c, and 501d. One of column selects 507 may then be asserted (block 603), causing the output of one of the columns (i.e., bit lines 512), to be passed to the column multiplexer output 513.

The operation then depends on the strength of the state of misread indication signal 510 (block 604). When misread indication signal 510 is asserted, the second gain level of second sense amplifier 504 may be selected by asserting second gain_select2 signal 517 and isolation control signal 519 (block 607), and the data on column multiplexer output 502 is amplified by the second gain level of the second sense amplifier 203 and coupled to the input of output circuit 505 through node 514 (block 608). Output circuit 505 then couples the output of second sense amplifier 504 to data out 511 (block 609). The sub-array may then be re-initialized by de-asserting second gain_select2 signal 517, isolation control signal 519, row selects 506, and column selects 507, and asserting pre-charge signal 510 (block 601).

When misread indication signal 510 is not asserted, the first gain level of first sense amplifier 503 may be selected by asserting first gain_select1 signal 508 and isolation control signal 519 (block 605), and the data on column multiplexer output 502 may be amplified by the first gain level of first sense amplifier 503 and coupled to an input of output circuit 505 through node 515 (block 606). Output circuit 505 then couples the output of first sense amplifier 503 to data 511 (block 609). The sub-array may then be re-initialized by de-asserting first gain_select1 signal 508, isolation control signal 519, row selects 506, and column selects 507, and asserting pre-charge signal 518 (block 601).

It is noted that in some embodiments, first gain_select1 signal 508, first gain_select2 signal 516, second gain_select1 signal 509, and second gain_select2 signal 517 may be asserted in a different fashion. For example, when misread indication signal 510 is asserted, first gain_select2 signal 516 may be asserted causing the output of column multiplexer 502 to be amplified by the second gain level of first sense amplifier 503. In other embodiments, the aforementioned gain select signals may be operated simultaneously.

Figure 7:
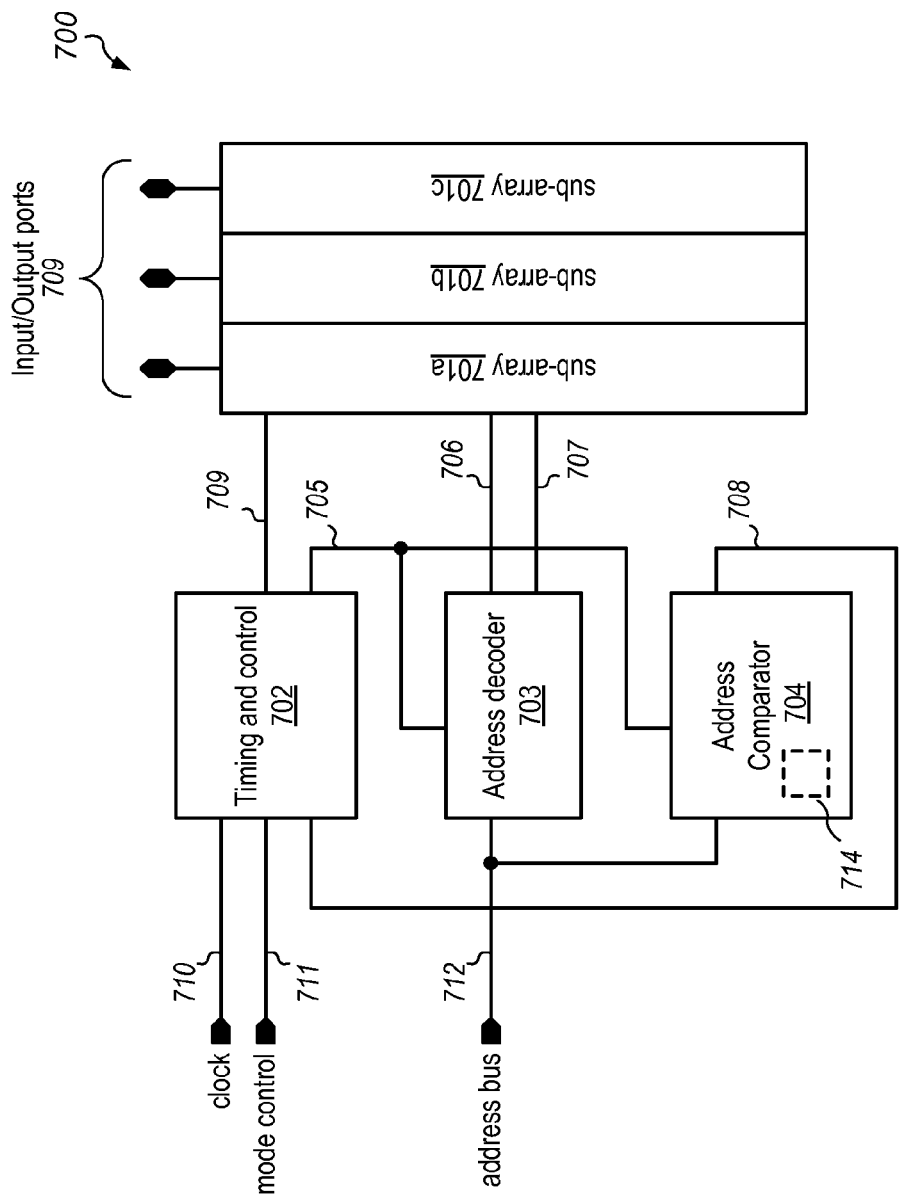
FIG. 7 illustrates an embodiment of a memory.

FIG. 7 illustrates a memory according to one of several possible embodiments. In the illustrated embodiment, memory 700 includes data input/output ports 709 and an address bus input 712. Memory 700 further includes a mode control input 711 and an input clock 710.

In the illustrated embodiment, memory 700 includes sub-arrays 701a, 701b, and 701c, timing and control unit 702, address decoder 703, and address comparator 704. Sub-arrays 701a, 701b, and 701c may incorporate some or all of the features described above with respect to sub-arrays 200 and 500. Timing and control unit 702 is coupled to provide a decoder enable signal 705 to address decoder 703 and address comparator 704, and control signals 709 to sub-arrays 701a, 701b, and 701c. In some embodiments, control signals 709 may include a pre-charge signal, an isolation control signal, a first gain selection signal, and a second gain select signal that may operate as described above with respect to sense amplifier 300. In other embodiments, address comparator 704 may include a storage unit 714.

Address decoder 703 is coupled to provide row selects 706 and column selects 707 to sub-arrays 701a, 701b, and 701c, in response to the assertion of decoder enable signal 705 and the address value on address bus 712. Address comparator 704 is coupled to provide read-miss indication signal 708 to timing and control circuit 702 based upon a comparison of the address value on address bus 712 to a collection of address values previously determined to select weak data storage cells in sub-arrays 701a, 701b, and 701c.

In some embodiments, memory 700 may implement a weak bit test such that the collection of address values that select weak data storage cells can be updated post-manufacture such that the address values that select data storage cells that become weak over time may be added to the collection of address values. In other embodiments, the collection of addresses that contain weak cells is determined at the time of initial test and may be stored using fuses or other non-volatile storage.

Figure 8:
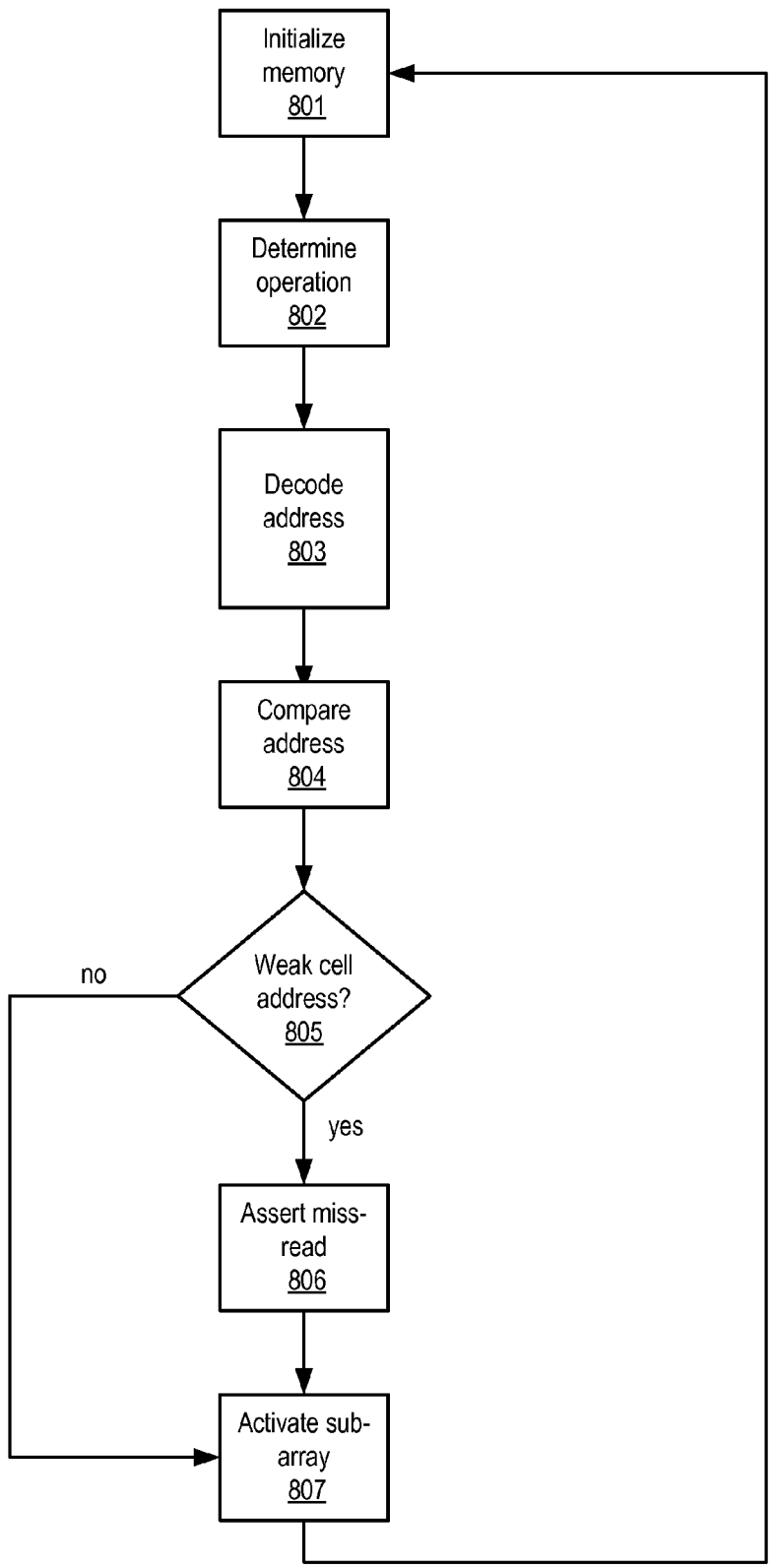
FIG. 8 illustrates a possible method of operating the embodiment illustrated in FIG. 7.

FIG. 8 illustrates a possible method of operation of memory 700. It is noted that during actual circuit operation, some or all of the operations illustrated in FIG. 8 may occur in a different order, or may occur concurrently rather than sequentially. The method begins by initializing memory 700 (block 801). When clock 710 is asserted, the mode of operation may be determine based on the state of mode control 711 (block 802). For a read operation, timing and control unit 702 asserts decoder enable signal 705 causing address decoder 703 to decode the address value on address bus 712 and assert one of row selects 706 and one of column selects 707 (block 803). In response to the assertion of decoder enable signal 705, address comparator 704 may compare the address value on address bus 712 to the collection of address values previously determined to select weak data storage cells (block 804).

The operation then depends on the result of the address value comparison (block 805). When the address matches the address of one of the collection of addresses previously determined to select weak data storage cells, misread signal 708 may be asserted (block 806). The sub-arrays 701a, 701b, and 701c are activated. In some embodiments, the sub-array activation operation works as previously described with respect to FIG. 3.

Figure 9:
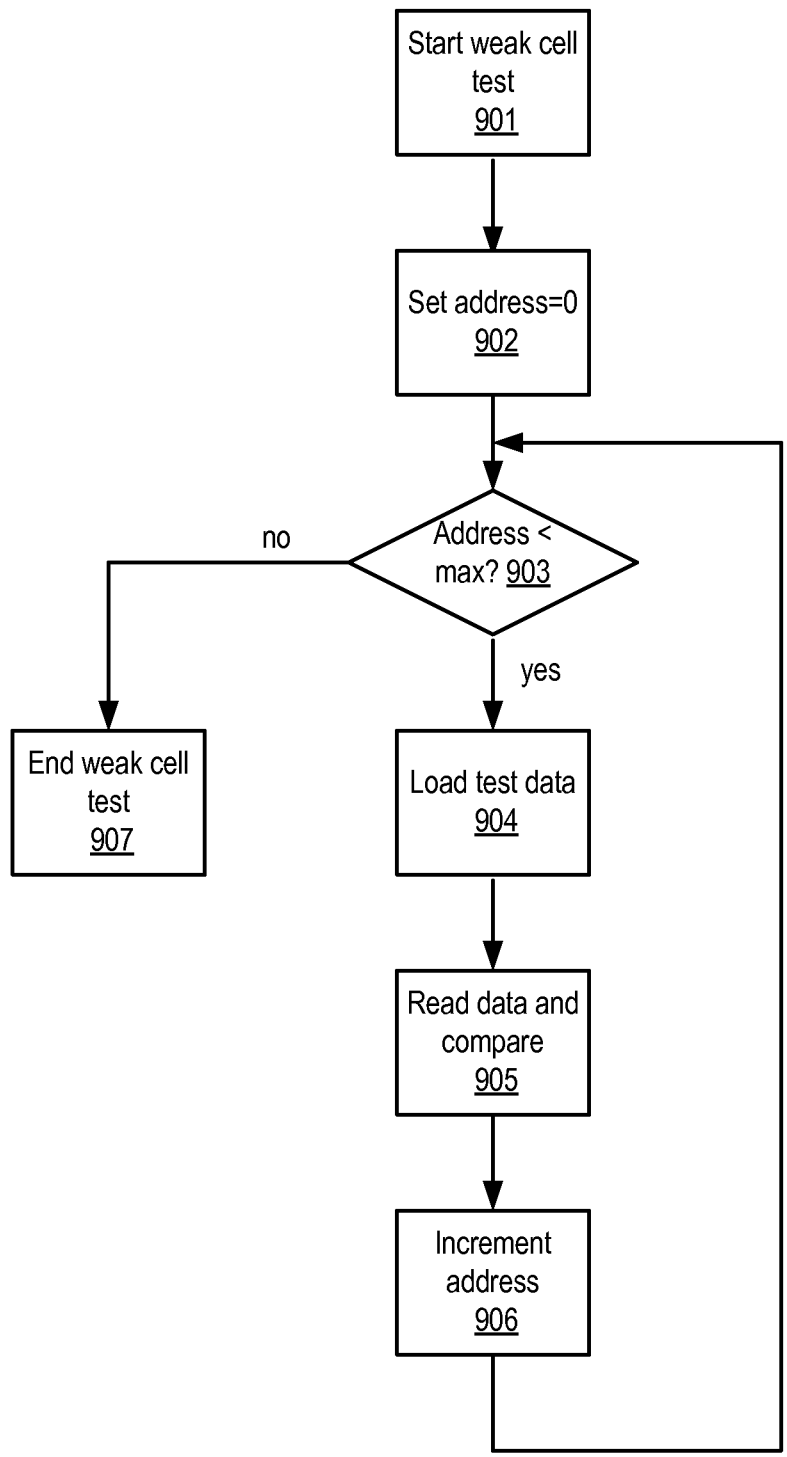
FIG. 9 illustrates a possible method of testing a memory for weak data storage cells.

FIG. 9 illustrates a possible method of operation of a memory to test for weak data storage cells. The test starts in block 901. The address to be tested may be initially set to zero (block 902). The operation then depends on the value of the test address (block 903). If the test address value is greater than the maximum address for the memory, the test ends (block 907). If the test address value is less than the maximum address for the memory, test data may be loaded into the data storage cells located at the test address (block 904). Once the test data has been loaded, it may be read back and compared as will be described with respect to FIG. 10 (block 905). The test address may then be incremented and the value checked against the maximum address for the memory (block 906). It is noted that the operations shown in FIG. 9 are merely an illustrative example and that other methods of detecting weak data storage cells are possible.

Figure 10:
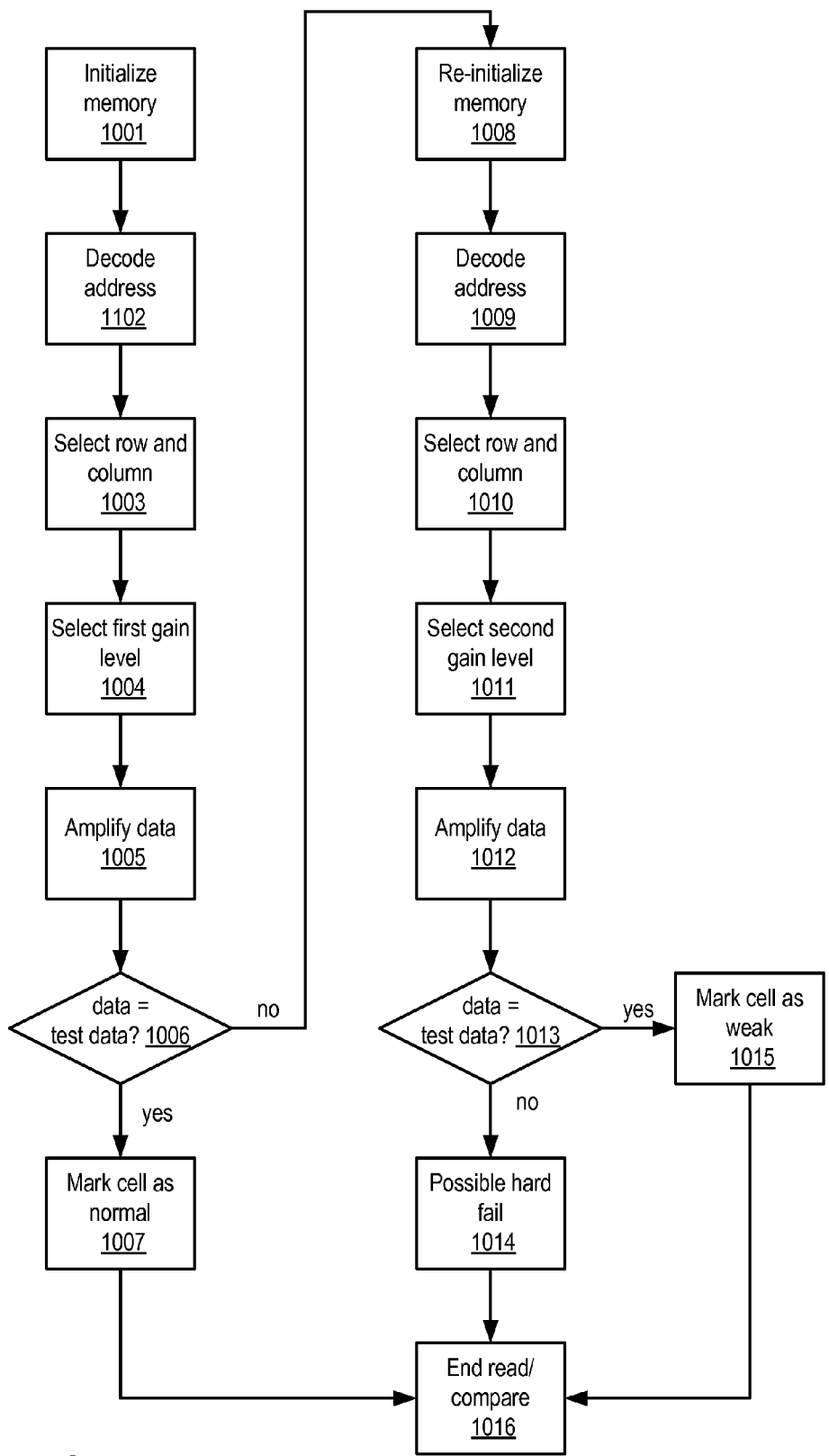
FIG. 10 illustrates a possible method of reading a data storage cell and comparing the stored data to previously loaded test data.

FIG. 10 illustrates a possible method of operation of a memory to read and compare previously loaded test data as referenced above with respect to FIG. 9. It is noted that during actual circuit operation, some or all of the operations illustrated in FIG. 10 may occur in a different order, or may occur concurrently rather than sequentially. The memory may be first initialized (block 1001). The address containing the location of the data storage cells to be examined may then be decoded (block 1002) so that the corresponding row and column can be selected (block 1003). The first gain level for the sense amplifiers may be selected (block 1004). With the gain level for the sense amplifiers selected, the data from the selected data storage cells may be amplified (block 1005). The operation then depends on the amplified data (block 1006). For each of the selected data storage cells, if the amplified data from the cell is the same as the test data, then the cell may be marked as being of normal strength (block 1007) and the operation is complete (block 1016). If the amplified data is not the same as the test data, then the memory may be re-initialized (block 1008).

As before, the address may be decoded (block 1009) and the corresponding row and column are selected (block 1010). The second gain level of the sense amplifiers may then be selected (block 1011) and the data from the selected data storage cells may be amplified (block 1012). The operation then depends on the amplified data (block 1013). For each of the selected data storage cells, if the amplified data from the data storage cell is the same as the test data, then the data storage cell may be marked as being weak (block 1015) and the operation may be complete (block 1016). If the amplified data is not the same as the test data, then the data storage cell may be marked as a possible hard failure (block 1014) and the operation may then be concluded (block 1016).

Figure 11:
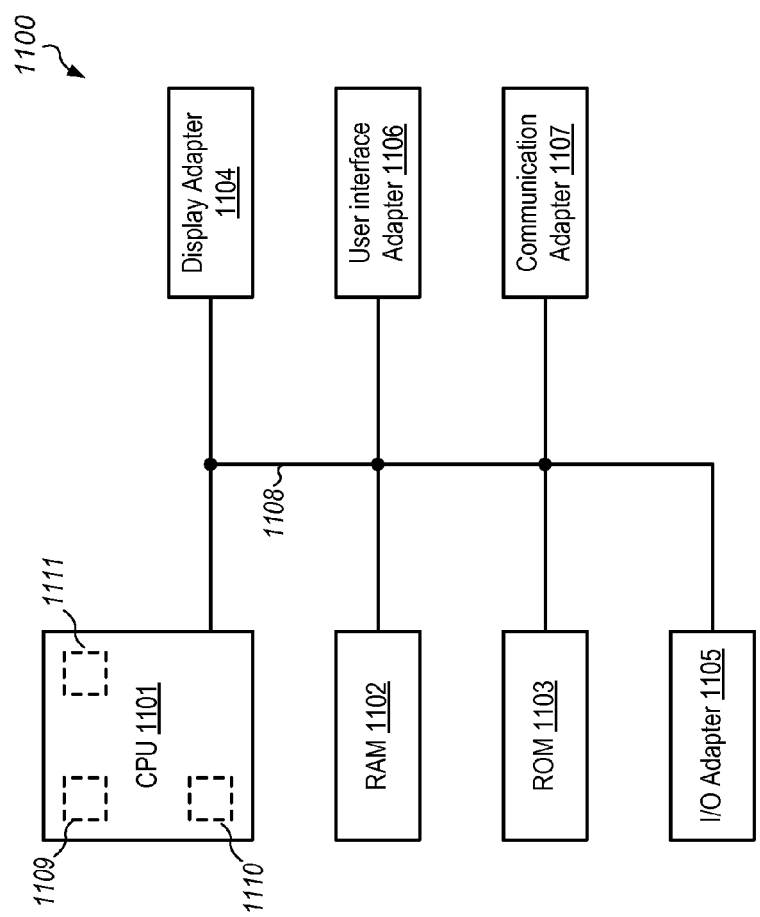
FIG. 11 illustrates an embodiment of a computing system.

Turning now to FIG. 11, a block diagram of a system is illustrated. In the illustrated embodiment, the system 1100 includes an instance of a random access memory (RAM) 1102 and a read-only memory (ROM) 803 which each may include one or more sense amplifiers that may incorporate some or all of the features described above with respect to sense amplifier 400 and sub-arrays 200 and 500. The illustrated embodiment also includes a CPU 1101 which may include one or more local storage units 1109. For example, CPU 1101 may include a Cache Data RAM, a Tag RAM, one or more register files, and one or more FIFOs. Each one of the local storage units 1109 may include one more sense amplifiers that may incorporate some or all of the features described above with respect to sense amplifier 400. CPU 1101 may also include a test unit 1110 and a test storage array 1111. Additionally, the illustrated embodiment includes an I/O adapter 1105, a display adapter 1104, a user interface adapter 1106, a communication adapter 1107, and a communication bus 1108.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a plurality of columns, wherein each of the columns includes a plurality of data storage cells, and wherein each data storage cell is configured to generate a column output in response to asserting a row selection signal;
a column multiplexer coupled to receive input data from the plurality of columns, wherein the column multiplexer is configured to controllably select data from one of the plurality of columns to generate a column multiplexer output dependent upon a column selection signal;
circuitry configured to:
detect cell strength of a given data storage cell;
generate a gain selection signal dependent upon the detected cell strength;
store cell strength information indicative of the detected cell strength; and
check the stored cell strength information; and
a sense amplifier configured to amplify input data from the column multiplexer, wherein the sense amplifier is controllable to provide a first gain level or a second gain level dependent upon a gain selection signal.

2. The apparatus of claim 1, wherein the first gain level is set by the selection of a first gain device, and wherein the second gain level is set by the selection of a second gain device.

3. The apparatus of claim 2, wherein the transconductance of the second gain device is larger than the transconductance of the first gain device.

4. The apparatus of claim 2, wherein the first gain device comprises a plurality of transistors, and wherein the second gain device comprises a plurality of transistors.

5. A method, comprising:
detecting cell strength for a data storage cell;
amplifying data from the data storage cell using a sense amplifier controlled to provide a first gain level or a second gain level dependent upon the detected cell strength;
storing cell strength information indicative of the detected cell strength; and
checking the stored cell strength information.

6. The method of claim 5, further comprising:
amplifying data from the data storage cell using the sense amplifier set to provide the second gain level in response to the detected cell strength being indicative of a weak data storage cell, wherein the second gain level is higher than the first gain level.

7. The method of claim 6, further comprising:
storing test data into the data storage cell; and
comparing the stored test data to the test data to detect cell strength.

8. A memory circuit, comprising:
a plurality of sub-arrays, wherein each of the sub-arrays comprises:
a plurality of columns, wherein each of the columns includes a plurality of data storage cells, and wherein each data storage cell is configured to generate a column output in response to asserting a respective one of a plurality of row selection signals; and
a column multiplexer configured to receive input data from the plurality of columns, wherein the column multiplexer is configured to controllably select data from one of the plurality of columns in response to the assertion of a respective one of a plurality of column selection signals; and
a sense amplifier configured to receive input data from the column multiplexer, wherein the sense amplifier outputs the input data amplified by a first gain level or a second gain level dependent upon a gain selection signal;
a timing and control unit configured to generate a gain selection signal; and
an address decoder configured to receive an input address such that, in response to the value of the input address, the address decoder asserts one of the plurality of row selection signals and one of the plurality of column selection signals,
wherein the address decoder includes a storage array and a comparator configured to compare the input address to the contents of the storage array;
wherein the address decoder is further configured to assert a misread indication signal when the comparator detects a match between the input address and the contents of the storage array; and
wherein the timing and control unit is further configured to generate the gain selection signal dependent upon the misread indication signal.

9. A system, comprising:
one or more memories; and
a processing unit, wherein the processing unit includes one or more storage arrays, wherein each of the each of the storage arrays includes:
  a plurality of data storage cells; and
  a plurality of sense amplifiers, wherein each sense amplifier is configured to amplify input data from a selected one of the plurality of data storage cells, wherein each sense amplifier is controllable to provide a first gain level or a second gain level dependent upon a gain selection signal; and
  a test unit configured to provide the gain selection signal during test mode;
wherein the processing unit is configured to provide the gain selection signal dependent upon cell strength information.

10. The system of claim 9, wherein the processing unit includes a test storage array configured to store cell strength information.

* * * * *